United States Patent
Mai et al.

(10) Patent No.: US 10,692,815 B2
(45) Date of Patent: Jun. 23, 2020

(54) CHIP ON GLASS PACKAGE ASSEMBLY

(71) Applicant: Novatek Microelectronics Corp., Hsinchu (TW)

(72) Inventors: Wei-Kuo Mai, Hsinchu (TW); Chiao-Ling Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/680,202

(22) Filed: Aug. 17, 2017

(65) Prior Publication Data

US 2019/0057938 A1 Feb. 21, 2019

(51) Int. Cl.
| | |
|---|---|
| *H01L 23/538* | (2006.01) |
| *H01L 23/00* | (2006.01) |
| *H01L 23/544* | (2006.01) |
| *H01L 23/498* | (2006.01) |
| *H05K 1/14* | (2006.01) |
| *H01L 25/18* | (2006.01) |

(52) U.S. Cl.
CPC .... *H01L 23/5386* (2013.01); *H01L 23/49811* (2013.01); *H01L 23/544* (2013.01); *H01L 24/06* (2013.01); *H01L 24/13* (2013.01); *H01L 24/16* (2013.01); *H05K 1/147* (2013.01); *H01L 25/18* (2013.01); *H01L 2223/5442* (2013.01); *H01L 2223/54426* (2013.01); *H01L 2223/54473* (2013.01); *H01L 2224/0401* (2013.01); *H01L 2224/05014* (2013.01); *H01L 2224/06134* (2013.01); *H01L 2224/13019* (2013.01); *H01L 2224/13144* (2013.01); *H01L 2224/16227* (2013.01); *H01L 2224/81129* (2013.01); *H01L 2924/14* (2013.01); *H01L 2924/1426* (2013.01); *H01L 2924/1434* (2013.01); *H05K 1/148* (2013.01)

(58) Field of Classification Search
CPC .......... H01L 23/5386; H01L 23/49811; H01L 23/544
USPC ........................................ 257/668
See application file for complete search history.

(56) References Cited

U.S. PATENT DOCUMENTS

| | | |
|---|---|---|
| 7,982,844 B2 | 7/2011 | Lee |
| 8,059,250 B2 | 11/2011 | Lee |

(Continued)

FOREIGN PATENT DOCUMENTS

| | | |
|---|---|---|
| CN | 101211043 | 7/2008 |
| CN | 102254523 | 11/2011 |
| CN | 102819132 | 12/2012 |

OTHER PUBLICATIONS

"Office Action of China Counterpart Application", dated Mar. 27, 2020, p. 1-p. 6.

*Primary Examiner* — Bo Fan
(74) *Attorney, Agent, or Firm* — JCIPRNET

(57) ABSTRACT

A chip on glass package assembly includes a glass substrate, a first type chip, a second type chip and a plurality of connecting lines. The glass substrate includes an active area and a peripheral area connected to the active area. The first type chip is mounted on the peripheral area and including a processor. The second type chip is mounted on the peripheral area and located on a side of the first type chip, wherein the second type chip is different from the first type chip. The connecting lines are disposed on the peripheral area and connecting the first type chip and the second type chip.

16 Claims, 3 Drawing Sheets

(56) References Cited

U.S. PATENT DOCUMENTS

| | | | |
|---|---|---|---|
| 2005/0243501 A1* | 11/2005 | Muffoletto | H01G 9/06 361/534 |
| 2007/0229751 A1* | 10/2007 | Ko | G02F 1/13452 349/149 |
| 2008/0158466 A1 | 7/2008 | Lee | |
| 2011/0244752 A1 | 10/2011 | Lee | |
| 2011/0285679 A1 | 11/2011 | Oh et al. | |
| 2013/0155390 A1* | 6/2013 | Jensen | G01B 11/06 356/72 |
| 2014/0138123 A1* | 5/2014 | Chen | H05K 1/11 174/251 |
| 2015/0181697 A1* | 6/2015 | Goida | H01L 21/78 361/728 |
| 2017/0047313 A1* | 2/2017 | Yang | H01L 23/15 |
| 2017/0229426 A1* | 8/2017 | Hung | H01L 21/486 |

\* cited by examiner

CHIP ON GLASS PACKAGE ASSEMBLY

BACKGROUND

Technical Field

The present disclosure generally relates to a chip package. More particularly, the present disclosure relates to a chip on glass package assembly.

Description of Related Art

Touch and display technology in recent years has been widely used in various multimedia electronic products, especially in portable mobile products, such as mobile phones, e-books, tablet computers, and so on. By using touch and display technology as an input means, it can effectively replace the current input methods of keyboard or mouse. In addition to convenience, due to the operation intuitive property, the touch input technology has become a very popular interactive way between the man-machine interface and the multimedia.

Generally, the touch and display panel is electrically connected to a driving device through a circuit board, so that the signal of the touch and display panel can be transmitted into the driving device. In addition, a flexible circuit board with electronic devices (ex: flash memory IC, resistor, capacitor, etc.) mounted thereon is electrically connected to the sensing array, so that driving signals can be input and sensing signals can be output. However, design and layout of the flexible circuit board is complex and cost for performing electrical test on the electronic devices on the flexible circuit board is expensive, which increases production cost of the touch and display.

SUMMARY

Accordingly, the present disclosure is directed to a chip on glass package assembly, which reduces the production cost thereof.

The present disclosure provides a chip on glass package assembly including a glass substrate, a first type chip, a second type chip and a plurality of connecting lines.

The glass substrate includes an active area and a peripheral area connected to the active area. The first type chip is mounted on the peripheral area and including a processor. The second type chip is mounted on the peripheral area and located on a side of the first type chip, wherein the second type chip is different from the first type chip. The connecting lines are disposed on the peripheral area and connecting the first type chip and the second type chip.

According to an embodiment of the present disclosure, the first type chip further includes a controller for accessing the second type chip.

According to an embodiment of the present disclosure, the chip on glass package assembly further includes a pixel array and a plurality of fan-out lines, wherein the pixel array disposed on the active area and the fan-out lines connect the pixel array and the first type chip.

According to an embodiment of the present disclosure, the first type chip is a driver chip.

According to an embodiment of the present disclosure, the second type chip is a flash memory chip.

According to an embodiment of the present disclosure, the peripheral area includes a first type chip region where the first type chip is disposed and an extensional region extended from the first type chip region along a long axis of the first type chip, and the second type chip is disposed within the extensional region.

According to an embodiment of the present disclosure, the first type chip and the second type chip are arranged in a side-by-side manner, and a width of the second type chip is equal to or smaller than a width of the first type chip.

According to an embodiment of the present disclosure, the second type chip includes a plurality of pads disposed on an active surface of the second type chip and a plurality of conductive bumps disposed on the pads, and the second type chip is mounted on the peripheral area through the conductive bumps.

According to an embodiment of the present disclosure, the second type chip further includes an alignment mark disposed on the active surface.

According to an embodiment of the present disclosure, the connecting lines are completely located on the peripheral area of the glass substrate.

According to an embodiment of the present disclosure, the chip on glass package assembly further includes a flexible printed circuit (FPC) board connecting between the glass substrate and a main board.

According to an embodiment of the present disclosure, the connecting lines includes a first portion and a second portion, the first portion is connected to the first type chip and extended to the FPC board, and the second portion connecting the first portion and is extended from the FPC board to the glass substrate to be connected to the second type chip.

According to an embodiment of the present disclosure, there are no chips disposed on the FPC board.

According to an embodiment of the present disclosure, the chip on glass package assembly further including a plurality of primary bond pads, a plurality of extending bond pads and a plurality of extending line, wherein the primary bond pads are connected to the connecting lines respectively, the extending line connects the primary bond pads and the extending bond pads respectively.

In light of the foregoing, in the chip on glass package assembly of the present disclosure, passive devices are integrated into the first type chip and the second type chip such as flash memory chip is disposed on the glass substrate. Therefore, the FPC board may be configured merely for electrical connecting the glass substrate, so layout and design of the FPC board can be simplified, and surface mount process for mounting electronic devices on the FPC board can be omitted, so as to reduce the production cost of the chip on glass package assembly and the cost for performing electrical test on the electronic devices on the FPC board can also be omitted

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
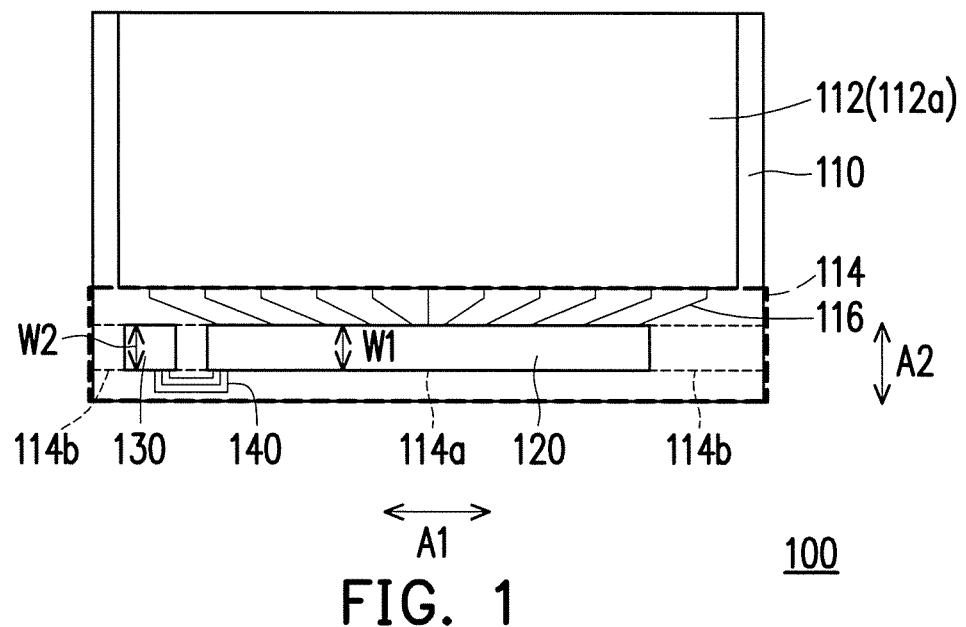
FIG. 1 is a partial top view of a chip on glass package assembly according to an exemplary embodiment.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
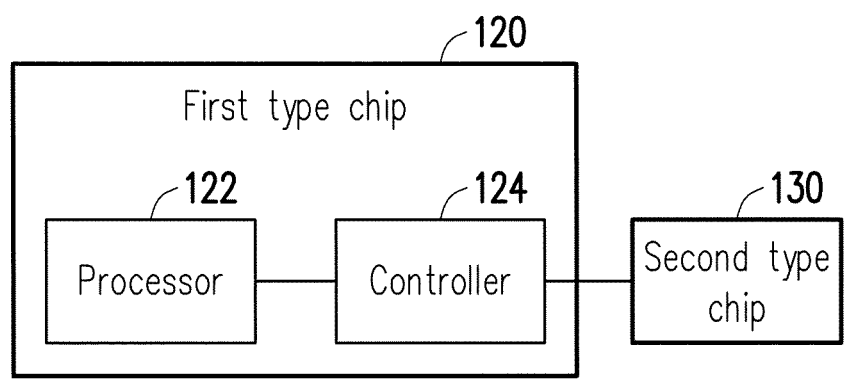
FIG. 2 is a block diagram of a chip on glass package assembly according to an exemplary embodiment.

FIG. 1 is a partial top view of a chip on glass package assembly according to an exemplary embodiment. FIG. 2 is a block diagram of a chip on glass package assembly according to an exemplary embodiment. Referring to FIG. 1 and FIG. 2, in the present embodiments, the chip on glass package assembly 100 may be a touch and display panel.

The chip on glass package assembly 100 includes a glass substrate 110, a first type chip 120, a second type chip 130 and a plurality of connecting lines 140. The glass substrate 110 includes an active area 112 and a peripheral area 114 connected to the active area 112. In the present embodiment, glass substrate 110 may further include a pixel array 112a and a plurality of fan-out lines 116. The pixel array 112a is formed by a plurality of pixel electrodes arranged in an array on the active area 112. The peripheral area 114 may be disposed on a side of the active area 112, and the fan-out lines 116 are disposed on the peripheral area 114 for connecting the pixel array 112a and the first type chip 120 as shown in FIG. 1.

In the present embodiment, the first type chip 120 is mounted on the peripheral area 114 and includes a processor 122. The second type chip 130 is also mounted on the peripheral area 114 and located on a side of the first type chip 120. In the present embodiment, the first type chip 120 may further include a controller 124 for accessing the second type chip 130 as shown in FIG. 2. The second type chip 130 is different from the first type chip 120. For example, the first type chip 120 may be a driver chip and the second type chip 130 may be a flash memory chip. The controller 124 of the first type chip 120 is capable of accessing the data stored in the second type chip 130. In the present embodiment, the first type chip 120 may be integrated with at least one passive device such as a resistor, a capacitor, an inductor or any combination thereof. However, the present embodiment is merely for illustration, and the disclosure does not limit the types of the first type chip 120 and the second type chip 130. The connecting lines 140 are disposed on the peripheral area 114 for connecting the first type chip 120 and the second type chip 130 as shown in FIG. 1.

In the present embodiments, the peripheral area 114 includes a first type chip region 114a and an extensional region 114b. The first type chip 120 is disposed within the first type chip region 114a. The extensional region 114b is extended from the first type chip region 114a along a long axis A1 of the first type chip 120, and the second type chip 130 is disposed within the extensional region 114b. For example, the first type chip 120 may be disposed on the central region of the peripheral area 114, so the central region where the first type chip 120 is disposed is the first type chip region 114a. Accordingly, the extensional region 114b may be extended from two opposite sides of the first type chip region 114a (i.e. the central region of the peripheral area 114) toward the edge of the glass substrate 110 along the long axis A1, and the second type chip 130 may be disposed on the extensional region 114b located, for example, on the left side of the first type chip region 114a.

In the present embodiment, the first type chip 120 and the second type chip 130 are arranged in a side-by-side manner, and a width of the second type chip W2 is equal to or smaller than a width of the first type chip W1, so the second type chip W2 would not take up additional space on the glass substrate 110 along a short axis A2 of the first type chip 120. In the present embodiment, the connecting lines 140 are completely located on the peripheral area 114 of the glass substrate 110 as shown in FIG. 1, but the disclosure does not limit the layout of the connecting lines 140.

Figure 3:
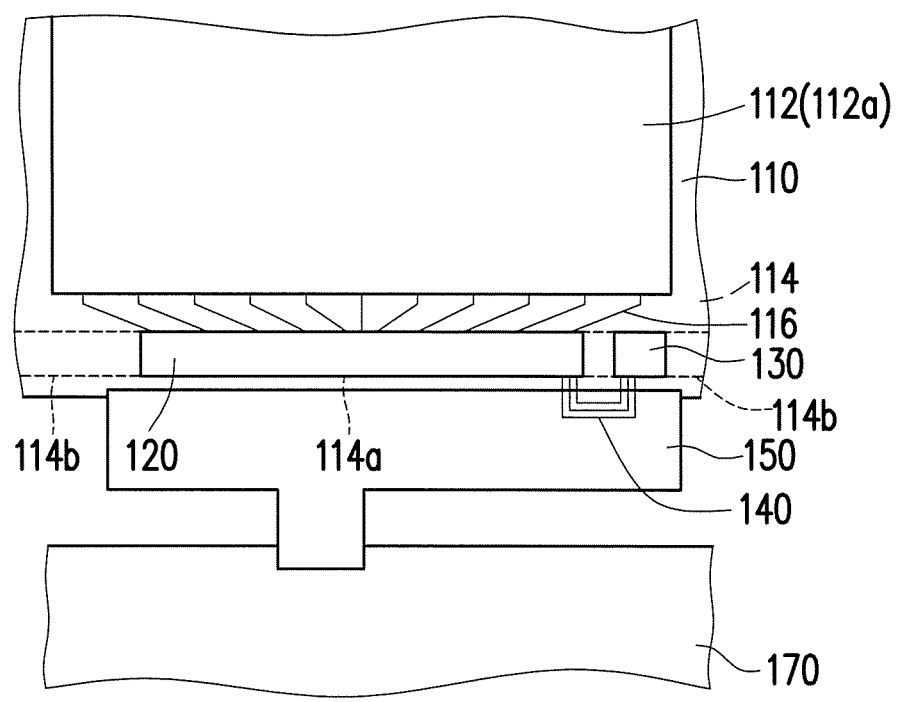
FIG. 3 is a partial top view of a chip on glass package assembly according to an exemplary embodiment.

FIG. 3 is a partial top view of a chip on glass package assembly according to an exemplary embodiment. It is noted that the chip on glass package assembly 100 shown in FIG. 3 contains many features same as or similar to the chip on glass package assembly 100 disclosed earlier with FIG. 1 and FIG. 2. For purpose of clarity and simplicity, detail description of same or similar features may be omitted, and the same or similar reference numbers denote the same or like components. The main differences between the chip on glass package assembly 100 shown in FIG. 3 and the chip on glass package assembly 100 shown in FIG. 1 and FIG. 2 are described as follows.

Referring to FIG. 3, in the present embodiment, the chip on glass package assembly 100 further includes a flexible printed circuit (FPC) board 150 connecting between the glass substrate 110 and a main board 170. The glass substrate 110 is electrically connected to the main board 170 through the FPC board 150. In the present embodiment, the connecting lines 140 may include a first portion and a second portion connected to each other. The first portion is connected to the first type chip 120 and extended to the FPC board 150, and the second portion is extended from the FPC board 150 to the glass substrate 110 to be connected to the second type chip 130. Therefore, in the embodiment shown in FIG. 1, the first type chip 120 is electrically connected to the second type chip 130 through the connecting lines 140 located entirely on the glass substrate 110. Whereas, in the present embodiment shown in FIG. 3, the first type chip 120 is electrically connected to the second type chip 130 through the FPC board 150 by extending the connecting lines 140 to the FPC board 150.

In the present embodiment, since the passive devices are integrated into the first type chip 120 and the second type chip 130 such as flash memory chip is disposed on the glass substrate 110, the FPC board 150 may be configured merely for electrical connecting the glass substrate 110 and the main board 170, so there may be no electronic devices disposed on the FPC board 150. Accordingly, layout and design of the FPC board 150 can be simplified, and surface mount process for mounting electronic devices on the FPC board 150 can be omitted, so as to reduce the production cost of the chip on glass package assembly 100 and the cost for performing electrical test on the electronic devices on the FPC board 150 can also be omitted.

Figure 4:
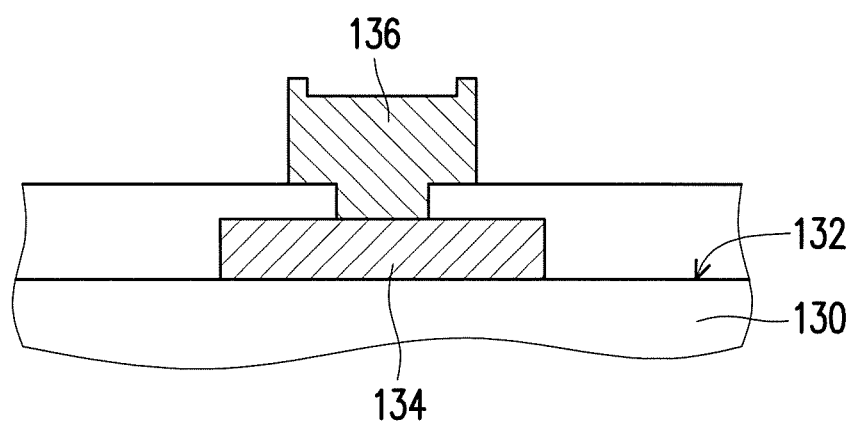
FIG. 4 is a partial cross-sectional view of a second type chip according to an exemplary embodiment.
Figure 5:
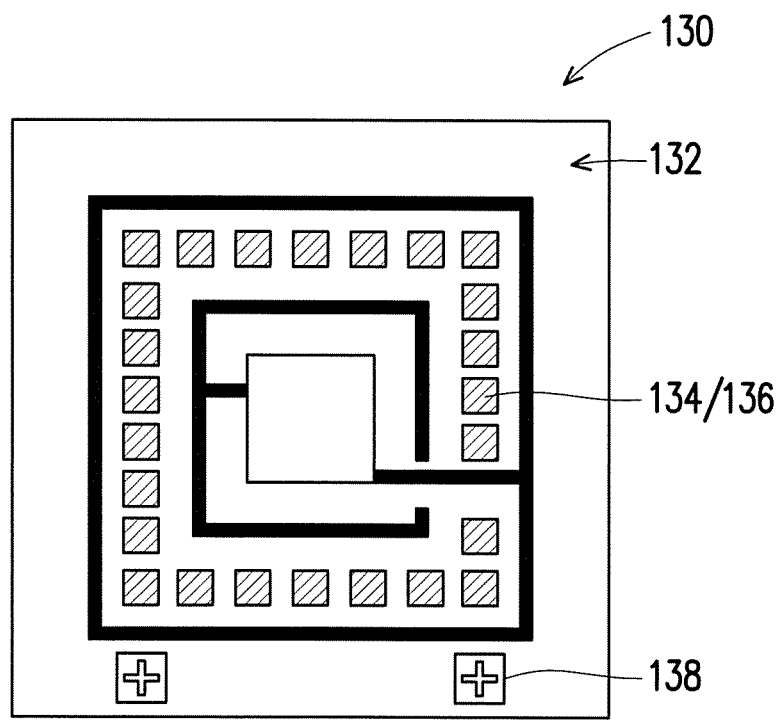
FIG. 5 is a bottom view of a second type chip according to an exemplary embodiment.

FIG. 4 is a partial cross-sectional view of a second type chip according to an exemplary embodiment. FIG. 5 is a bottom view of a second type chip according to an exemplary embodiment. Referring to FIG. 4 and FIG. 5, the second type chip 130 includes a plurality of pads 134 and a plurality of conductive bumps 136 as shown in FIG. 4. The pads 134 are disposed on an active surface 132 of the second type chip 130 and the conductive bumps 136 are disposed on the pads 134 respectively. With such configuration, the second type chip 130 can be mounted on the peripheral area 114 through the conductive bumps 136. In the present embodiment, the material of the conductive bumps 136 includes gold (Au) or any other suitable material, and the conductive bumps 136 may be formed by photolithography process, plating process, etc. Accordingly, the second type chip 130 can be mounted on the peripheral area 114 of the glass substrate 110 by flip-chip bonding technique.

Referring to FIG. 5, in the present embodiment, the second type chip 130 further includes at least one alignment mark 138 (two alignment marks 138 are illustrated), which is disposed on the active surface 132 as shown in FIG. 5. The alignment mark 138 may be disposed on a periphery of the second type chip 130, so the second type chip 130 can be mounted on the glass substrate 110 by flip-chip bonding technique with the help of the alignment mark 138 to perform alignment between the second type chip 130 and the glass substrate 110.

Figure 6:
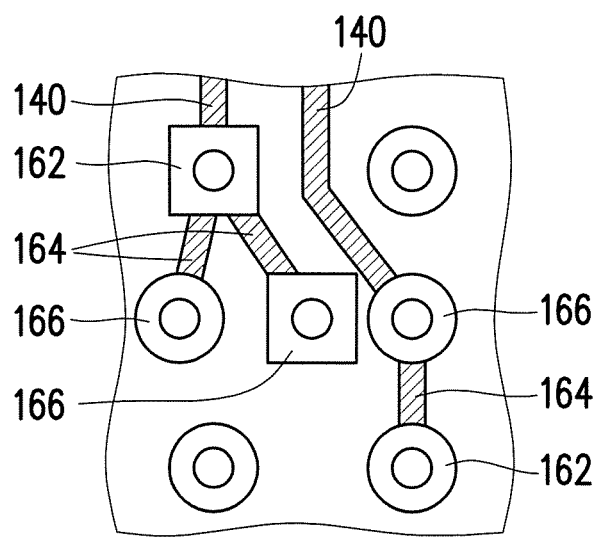
FIG. 6 is a partial top view of a layout of a glass substrate according to an exemplary embodiment.

FIG. 6 is a partial top view of a layout of a glass substrate according to an exemplary embodiment. Referring to FIG. 6, in the present embodiment, various layouts of the bond pads may be formed on the glass substrate 110 in order to adapt various types of chips to be mounted on the glass substrate 110. Accordingly, the glass substrate 110 may further includes a plurality of primary bond pads 162, a plurality of extending line 164 and a plurality of extending bond pads 166. The primary bond pads 162 are connected to the connecting lines 140 respectively, the extending line 164 connects the primary bond pads 162 and the extending bond pads 166 respectively.

For example, the primary bond pads 162 connected to the connecting lines 140 may be the bond pads suitable for being bonded with the conductive bumps 136 of the second type chip 130. The extending bond pads 166 connected to the primary bond pads 162 through the extending line 164 may be the bond pads suitable for being bonded with conductive bumps of a third type chip 130. The layout of the conductive bumps 136 of the second type chip 130 may be different from the layout of the conductive bumps of the third type chip 130, so the locations of the primary bond pads 162 are different from the the locations of the extending bond pads 166, and the extending line 164 are configured to electrically connect between the primary bond pads 162 and the extending bond pads 166. With such configuration, the glass substrate 110 is suitable for being mounted with various chips with various layouts of conductive bumps. Therefore, the application flexibility of the chip on glass package assembly 100 can be improved.

It is noted that the present embodiment is merely for illustration, and the disclosure does not limit layout and numbers of the glass substrate 110 and the numbers of the primary bond pads 162, the extending line 164 and the extending bond pads 166.

In sum, in the chip on glass package assembly of the present disclosure, passive devices are integrated into the first type chip and the second type chip such as flash memory chip is disposed on the glass substrate. Therefore, the FPC board may be configured merely for electrical connecting the glass substrate, so layout and design of the FPC board can be simplified, and surface mount process for mounting electronic devices on the FPC board can be omitted, so as to reduce the production cost of the chip on glass package assembly and the cost for performing electrical test on the electronic devices on the FPC board can also be omitted.

In addition, various layouts of the bond pads may be formed on the glass substrate in order to adapt various types of chips to be mounted on the glass substrate, so the glass substrate is suitable for being mounted with various chips with various layouts of conductive bumps. Therefore, the application flexibility of the chip on glass package assembly can be improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. A chip on glass package assembly, comprising:
a glass substrate comprising an active area and a peripheral area connected to the active area, wherein the peripheral area is disposed at a peripheral side of the active area, and lower surfaces and upper surfaces of the peripheral area and the active area are coplanar respectively;
a pixel array disposed directly on the upper surface of the active area of the glass substrate;
a first type chip mounted on the upper surface of the peripheral area and comprising a processor, wherein the first type chip is electrically connected to the pixel array;
a second type chip mounted on the upper surface of the peripheral area and located on a side of the first type chip, wherein the second type chip is different from the first type chip; and
a plurality of connecting lines disposed on the peripheral area and connecting the first type chip and the second type chip.
2. The chip on glass package assembly according to claim 1, wherein the first type chip further comprises a controller for accessing the second type chip.
3. The chip on glass package assembly according to claim 1, wherein the glass substrate further comprises a pixel array and a plurality of fan-out lines, wherein the pixel array disposed on the active area and the fan-out lines connect the pixel array and the first type chip.
4. The chip on glass package assembly according to claim 1, wherein the first type chip is a driver chip.
5. The chip on glass package assembly according to claim 1, wherein the second type chip is a flash memory chip.
6. The chip on glass package assembly according to claim 1, wherein the peripheral area comprises a first type chip region where the first type chip is disposed and an extensional region extended from the first type chip region along a long axis of the first type chip, and the second type chip is disposed within the extensional region.
7. The chip on glass package assembly according to claim 1, wherein the first type chip and the second type chip are arranged in a side-by-side manner, and a width of the second type chip is equal to or smaller than a width of the first type chip.
8. The chip on glass package assembly according to claim 1, wherein the second type chip comprises a plurality of pads disposed on an active surface of the second type chip and a plurality of conductive bumps disposed on the pads, and the second type chip is mounted on the peripheral area through the conductive bumps.
9. The chip on glass package assembly according to claim 8, wherein the second type chip further comprises an alignment mark disposed on the active surface.
10. The chip on glass package assembly according to claim 1, wherein the connecting lines are completely located on the peripheral area of the glass substrate.

11. The chip on glass package assembly according to claim 1, further comprising a flexible printed circuit (FPC) board connecting between the glass substrate and a main board.

12. The chip on glass package assembly according to claim 11, wherein the connecting lines comprises a first portion and a second portion, the first portion is connected to the first type chip and extended to the FPC board, and the second portion connecting the first portion and is extended from the FPC board to the glass substrate to be connected to the second type chip.

13. The chip on glass package assembly according to claim 11, wherein there are no electronic devices disposed on the FPC board.

14. The chip on glass package assembly according to claim 1, wherein the glass substrate further comprises a plurality of primary bond pads, a plurality of extending bond pads and a plurality of extending line, wherein the primary bond pads are connected to the connecting lines respectively, the extending line connects the primary bond pads and the extending bond pads respectively.

15. The chip on glass package assembly according to claim 9, wherein the active surface of the second type chip comprises a first area and a second area surrounding the first area, the pads and the conductive bumps are disposed on the first area of the active surface of the second type chip, and the alignment mark is disposed on the second area of the active surface of the second type chip.

16. A chip on glass package assembly, comprising:
a glass substrate comprising an active area and a peripheral area connected to the active area, wherein the peripheral area is disposed at a peripheral side of the active area, and lower surfaces and upper surfaces of the peripheral area and the active area are coplanar respectively;
a pixel array disposed on the upper surface of the active area of the glass substrate;
a first type chip mounted on the upper surface of the peripheral area and comprising a processor, wherein the first type chip is electrically connected to the pixel array;
a second type chip mounted on the upper surface of the peripheral area and located on a side of the first type chip, wherein the second type chip is different from the first type chip; and
a plurality of connecting lines disposed on the peripheral area and connecting the first type chip and the second type chip, wherein:
the second type chip comprises a plurality of pads disposed on an active surface of the second type chip and a plurality of conductive bumps disposed on the pads, and the second type chip is mounted on the peripheral area through the conductive bumps;
the second type chip further comprises an alignment mark; and
the active surface of the second type chip comprises a first area and a second area surrounding the first area, the pads and the conductive bumps are disposed on the first area of the active surface of the second type chip, and the alignment mark is disposed on the second area of the active surface of the second type chip.

* * * * *